(12) United States Patent
Kuwabara

(10) Patent No.: US 6,240,037 B1
(45) Date of Patent: May 29, 2001

(54) DYNAMIC RANDOM ACCESS MEMORY DEVICE HAVING BOOSTER AGAINST BATTERY EXHAUSTION

(75) Inventor: Shinichi Kuwabara, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 08/046,849

(22) Filed: Apr. 14, 1993

(30) Foreign Application Priority Data

Apr. 15, 1992 (JP) .................................................. 4-121349

(51) Int. Cl.[7] ........................................................ G11C 7/00
(52) U.S. Cl. ............................ 365/228; 365/226; 365/201
(58) Field of Search .................................... 365/226, 228, 365/201, 230.01, 231

(56) References Cited

U.S. PATENT DOCUMENTS 5,204,840 * 4/1993 Mazur .................................... 365/228

* cited by examiner

Primary Examiner—Terrell W. Fears
(74) Attorney, Agent, or Firm—Sughrue, Mion, Zinn, Macpeak & Seas

(57) ABSTRACT

In order to prevent data bits stored in the memory cells of a dynamic random access memory device from destruction, a booster circuit is coupled between a power supply pin and an internal power supply line, and keeps the voltage level on the internal power supply line constant regardless of the voltage level at the power supply pin.

2 Claims, 4 Drawing Sheets

DYNAMIC RANDOM ACCESS MEMORY DEVICE HAVING BOOSTER AGAINST BATTERY EXHAUSTION

FIELD OF THE INVENTION

This invention relates to a dynamic random access memory device and, more particularly, to a dynamic random access memory device equipped with an internal booster circuit for driving sense amplifier circuits with boosted voltage.

DESCRIPTION OF THE RELATED ART

A computer system is progressively scaled down, and various portable personal computer units are commercially available for users. The portable personal computer units are usually equipped with a secondary or rechargeable battery unit, and is powered with the rechargeable battery unit at any place inside and outside of a house.

Dynamic random access memory devices are incorporated in the portable personal computer unit, and a one-transistor one-capacitor memory cell is typical of the dynamic random access memory cells. The integration density of the dynamic random access memory device is progressively increased, and, on the contrary, the accumulated capacitance of the one-transistor onecapacitor type memory cell is decreased. The small capacitance only produces small differential voltage on the associated bit line pair, and the small differential voltage decreases a margin of the exact circuit behavior of the associated sense amplifier circuit. For this reason, various new technologies have been developed and used in the dynamic random access memory devices.

FIG. 1 illustrate an essential part of a typical example of the dynamic random access memory device, and reference numerals 1, 2, 3, 4 and 5 respectively designate a memory cell array 1, a precharging/ balancing circuit 2, a sense amplifier circuit, a driver circuit associated with the sense amplifier circuit 3 and a row address decoder/word line driver unit 5. Although FIG. 1 shows only one memory cell MC, a plurality of memory cells fabricate the memory cell array 1, and are arranged in rows and columns.

The memory cell MC is of the one-transistor and onecapacitor type, and is implemented by a series combination of an n-channel enhancement type switching transistor SW1 and a storage capacitor CP1. A word line WL is coupled with the gate electrode of the n-channel enhancement type switching transistor SW1, and the word line WL is driven by the row address decoder/word line driver unit 5. The drain node of the n-channel enhancement type switching transistor SW1 is coupled with a bit line BLa paired with a bit line BLb, and the bit lines BLa and BLb form in combination a bit line pair BLP. While row address decoder/word line driver unit 5 drives the word line WL to high voltage level, the n-channel enhancement type switching transistor SW1 turns on so as to couple the storage capacitor with the bit line BLa, and small differential voltage takes place between the bit lines BLa and BLb depending upon the amount of electric charges accumulated in the storage capacitor.

The precharging/ balancing circuit 2 comprises two n-channel enhancement type charging transistors SW2 and SW3 coupled in series between the bit lines BLa and BLb, and an n-channel enhancement type balancing transistor SW4 coupled between the bit lines BLa and BLb. The common source node of the n-channel enhancement type charging transistors SW2 and SW3 is coupled with a source of positive voltage level, and a precharge control signal is supplied to the gate electrodes of the n-channel enhancement type charging transistors SW2 and SW3 and to the gate electrode of the n-channel enhancement type balancing transistor SW4. While the precharge control signal goes up to high voltage level, the n-channel enhancement type charging transistors SW2 and SW3 and the n-channel enhancement type balancing transistor SW4 turn on, and the bit lines BLa and BLb are charged to a predetermined precharge level. The precharging is carried out before the row address decoder/word line driver unit 5 drives the word line WL, and the storage capacitor CP1 slightly changes the voltage level on the bit line BLa so that the small differential voltage takes place between the bit lines BLa and BLb.

The sense amplifier circuit 3 is implemented by a flip flop circuit or two series combinations of p-channel enhancement type field effect transistors QP1 and QP2 and n-channel enhancement type field effect transistors QN3 and QN4. The two series combinations are coupled between a high power supply line SAP and a lower power supply line SAN, and the common drain nodes DN1 and DN2 are respectively coupled with the bit lines BLa and BLb. The gate electrodes of the field effect transistors QP1 and QN3 are coupled with the drain node DN2, and the other drain node DN1 is coupled with the gate electrodes of the field effect transistors QP2 and QN4. When the sense amplifier circuit 3 is powered by the driver circuit 4, the sense amplifier circuit 3 develops the small differential voltage between the bit lines BLa and BLb.

The driver circuit 4 comprises a p-channel enhancement type switching transistor SW5 coupled between a positive power voltage line Vcc and the power supply line SAP, an n-channel enhancement type switching transistor SW6 coupled between a ground voltage line and the other power supply line SAN, an inverter IV1 and a balancing circuit 4a coupled between the power supply lines SAP and SAN, and the balancing circuit 4a has a series combination of n-channel enhancement type switching transistors SW7 and SW8 coupled between the power supply lines SAP and SAN and an n-channel enhancement type switching transistor SW9 coupled in parallel to the series combination between the power supply lines SAP and SAN. An activation signal is directly supplied to the gate electrode of the n-channel enhancement type switching transistor SW6, and the inverter IV1 supplies the complementary signal of the activation signal to the gate electrode of the p-channel enhancement type switching transistor SW5. The common source node of the n-channel enhancement type switching transistors SW7 and SW8 is coupled with a source of balance voltage level, and an inactivation signal is supplied to the gate electrodes of the n-channel enhancement type switching transistors SW7 to SW9. While the bit line pair BLP stays at the precharging level, the inactivation signal allow the n-channel enhancement type switching transistors SW7 to SW9 to turn on, and the power supply line SAP is balanced with the power supply line SAN at the balance voltage level. For this reason, the sense amplifier circuit 3 is kept inactive, and any current does not flow through the sense amplifier circuit 3. However, when the small differential voltage takes place between the bit lines BLa and BLb, the n-channel enhancement type switching transistors SW7 to SW9 turn off, and the activation signal and the complementary signal thereof allow the n-channel enhancement type switching transistor SW6 and the p-channel enhancement type switching transistor SW5 to turn on. Then, the power supply lines SAP and SAN are respectively conducted with the positive power supply line Vcc and the ground voltage line, and the positive power voltage Vcc and the ground voltage activates the sense amplifier circuit 3 for developing the small differential voltage.

Though not shown in FIG. 1, the differential voltage developed by the sense amplifier circuit is transferred to an output data buffer circuit, and the output data buffer circuit produces an output data signal indicative of a data bit stored in the memory cell MC from the differential voltage.

Thus, the electric charges accumulated in the storage capacitor is indicative of a data bit, and the data bit is propagated through the bit line pair BLP to the sense amplifier circuit 3 in the form of small differential voltage. Therefore, the amount of electric charges directly concerns the data propagation, and the voltage level on the bit line BLa is given by Equation 1.

$$Vx = (Cd \times Vd + Cs \times Vs)/(Cd+Cs) \qquad \text{Equation 1}$$

where Cd is the parasitic capacitance coupled with the bit line BLa, Cs is the capacitance of the storage capacitor CP1, Vd is the precharging level and Vs is the restore level at the storage capacitor CP1.

Then, the small differential voltage dVx is given by Equation 2.

$$dVx \times Vx - Vd = (Vs-Vd) \times Cs/(Cd+Cs) \qquad \text{Equation 2}$$

If the precharging level and the restore level are Vcc/2 and Vcc, Equation 2 is modified as $$\begin{aligned} dVx &= (Vcc/2) \times Cs/(Cd+Cs) \qquad \text{Equation 3} \\ &= (Vcc/2) \times (Cs/Cd) \times 1/(1+Cs/Cd) \end{aligned}$$

If the dynamic random access memory device is used as a data storage of the portable personal computer unit, the prior art dynamic random access memory device is powered by the rechargeable battery, and sometimes encounters undesirable exhaustion. This means that the restore level at the storage capacitor is lowered. The lowered restore level decreases the capacitance Cs and, accordingly, the small differential voltage. In the worst case, data bits stored therein are destroyed. In order to keep the differential voltage at the previous level, it is necessary to increase the capacitance Cs or, alternatively, decrease the parasitic capacitance Cd as will be understood from Equation 3. However, large capacitance Cs requires an enlarged storage capacitor occupying a large amount of real estate or a complex structure such as a trench structure or a stacked structure, and makes the semiconductor substrate large or the fabrication process complicate. Therefore, there are limits to the increase of capacitance Cs. On the other hand, in order to decrease the parasitic capacitance, it is necessary to shorten each bit line pair. However, the shorter the bit line pair, the fewer the memory cells. The number of bit line pairs is increased, and, accordingly, the increased bit line pairs require additional sense amplifier circuits. As a result, the semiconductor substrate is enlarged.

SUMMARY OF THE INVENTION

It is therefore an important object of the present invention to provide a dynamic random access memory device which prevents data bits from undesirable battery exhaustion.

To accomplish the object, the present invention proposes to provide a booster circuit between an external power supply pin and a driver circuit for sense amplifier circuits.

In accordance with the present invention, there is provided a dynamic random access memory device fabricated on a semiconductor substrate, comprising: a) a memory cell array having a plurality of memory cells respectively storing data bits each in the form of electric charges; b) a plurality of bit line pairs selectively coupled with the plurality of memory cells, and propagating data bits each in the form of differential voltage; c) an addressing means operative to selectively couple the plurality of memory cells with the plurality of bit line pairs; d) a plurality of sense amplifier circuits respectively coupled with the plurality of bit line pairs, and powered with high and low power voltage levels for developing the differential voltages on the plurality of bit line pairs; d) a driver circuit coupled with the plurality of sense amplifier circuits, and supply the high and low power voltage level to the plurality of sense amplifier circuits; and e) a booster circuit coupled between a power supply pin and the driver circuit for keeping the high power voltage produced from an external power voltage constant even if the external power voltage level is lowered.

The booster circuit may be activated when the external voltage level becomes lower than a predetermined level.

BRIEF DESCRIPTION OF THE DRAWINGS

The features and advantages of the dynamic random access memory device according to the present invention will be more clearly understood from the following description taken in conjunction with the accompanying drawings in which.

DESCRIPTION OF THE PREFERRED EMBODIMENTS

First Embodiment

Figure 1:
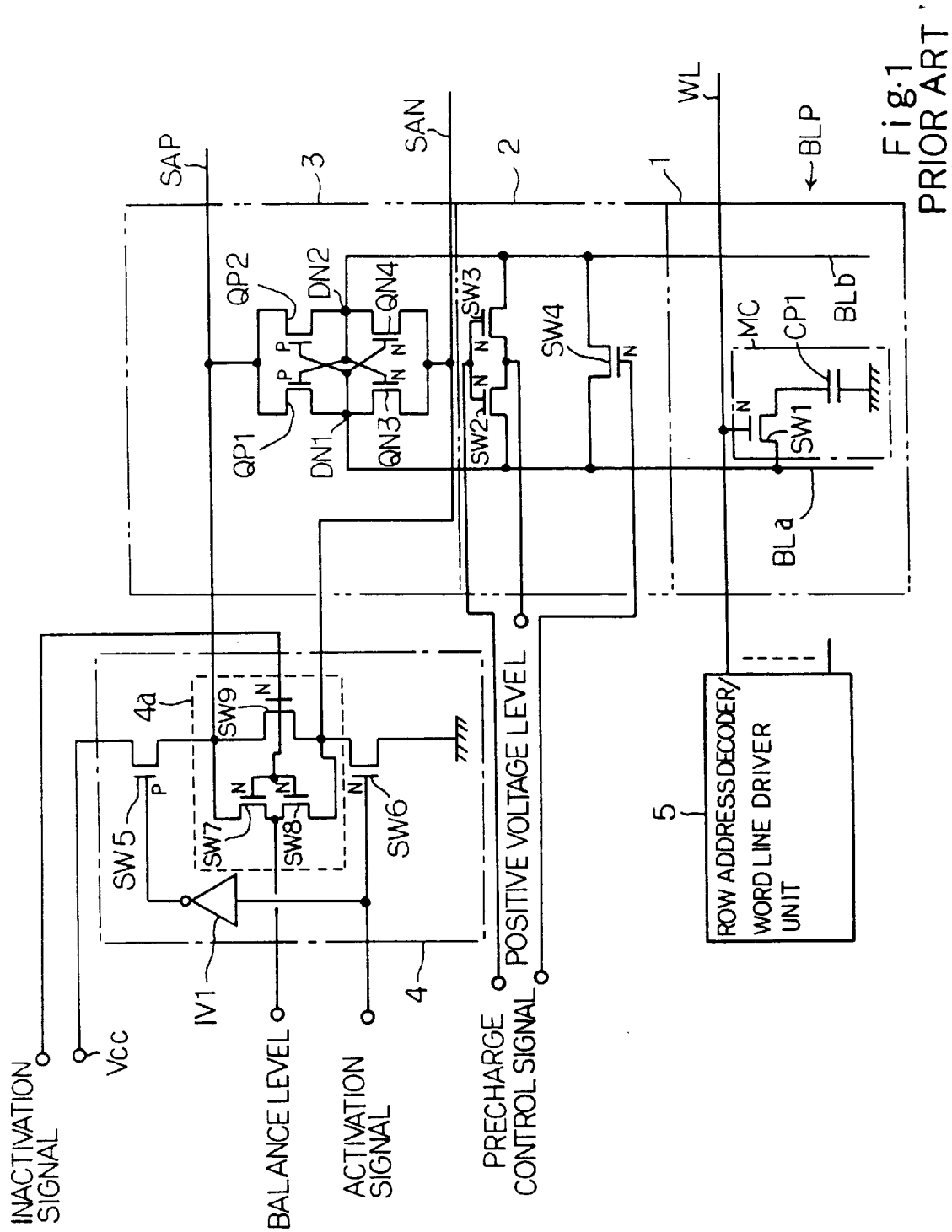
FIG. 1 is a circuit diagram showing the circuit arrangement of the prior art dynamic random access memory device.
Figure 2:
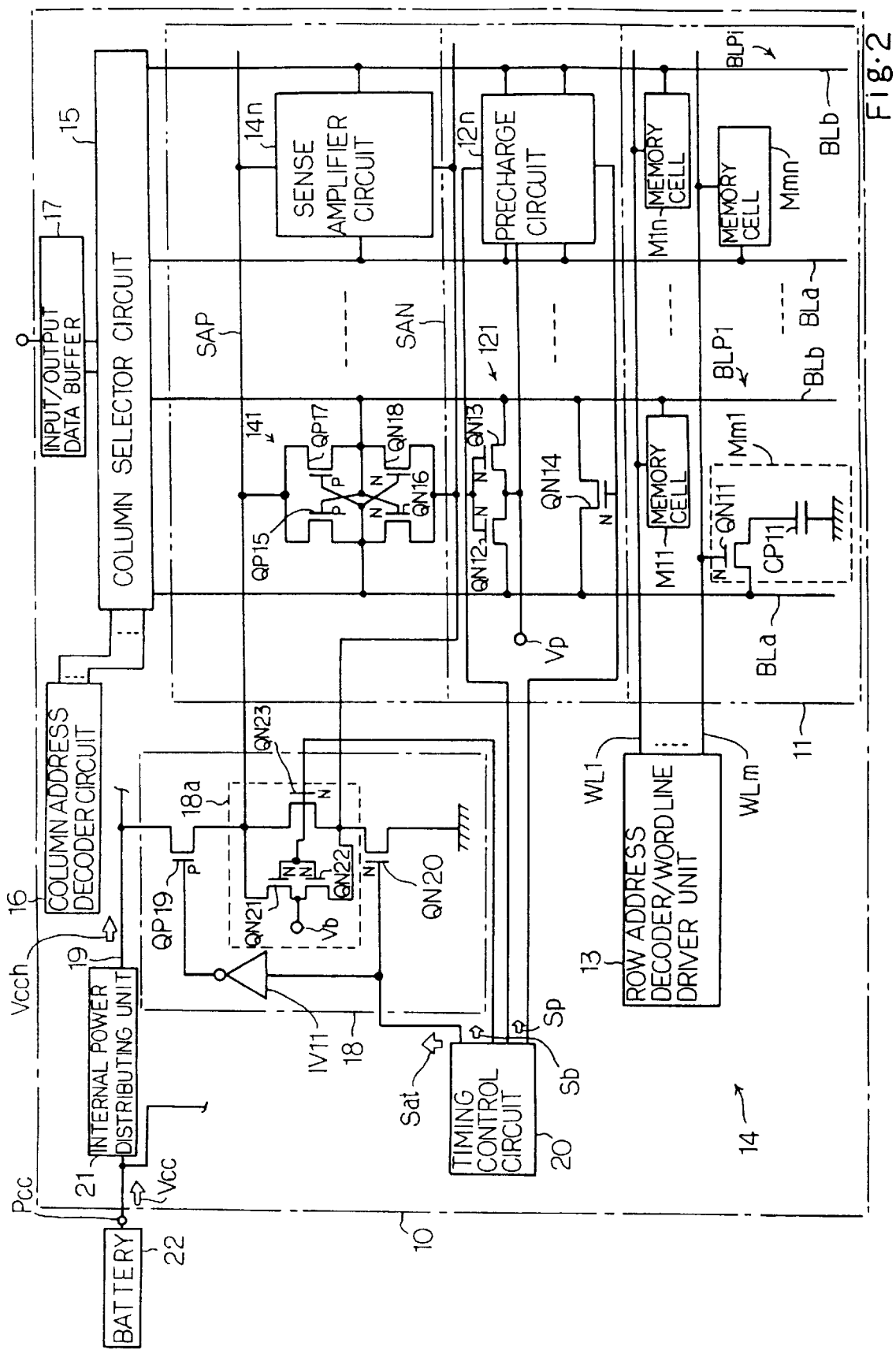
FIG. 2 is a circuit diagram showing the arrangement of a dynamic random access memory device according to the present invention.

Referring to FIG. 2 of the drawings, a dynamic random access memory device embodying the present invention is fabricated on a single semiconductor chip 10, and a memory cell array 11 is incorporated in the dynamic random access memory device. The memory cell array 11 is fabricated from a plurality of memory cells M11, Mn1, Mm1 and Mmn arranged in rows and columns, and each of the memory cells M11 to Mmn is implemented by a series combination of an n-channel enhancement type switching transistor QN11 and a storage capacitor CP11. The storage capacitors CP11 respectively store data bits in the form of electric charges, and the amount of electric charges are variable depending upon the logic level of the data bit stored therein.

A plurality of bit lines BLa and BLb are respectively associated with the columns of memory cells, and are coupled with the drain nodes of the n-channel enhancement type switching transistors QN11 of the associated columns. Every adjacent two bit lines BLa and BLb are paired with each other, and form in combination a bit line pair BLP1 or BLPi. A plurality of precharging circuits 121 to 12n are respectively coupled with the bit line pairs BLP1 to BLPi, and each of the precharging circuits 121 to 12n has a series combination of n-channel enhancement type switching transistors QN12 and QN13 coupled between a source of precharge level Vp and the associated bit line pair BLP1 or BLPi and an n-channel enhancement type switching transistor QN14. The n-channel enhancement type switching transistors QN12 to QN14 are responsive to a precharge control signal Sp, and allow the source of precharging level Vp to charge the bit lines BLa and BLb to the precharging level. In this instance, the bit lines BLa and BLb are charged to the intermediate level between the positive power voltage level Vcc and the ground voltage level.

A plurality of word lines WL1 to WLm are respectively associated with the rows of memory cells, and are coupled with the gate electrodes of the n-channel enhancement type switching transistors QN11 of the associated rows. The rows of memory cells are respectively assigned row addresses, and the word lines WL1 to WLm are also identified by the row addresses. The word lines WL1 to WLm are coupled with a row address decoder/word line driver unit 13, and the row address decoder/word line driver unit 13 is responsive to row address bits indicative of one of the row addresses for selectively driving the word lines WL1 to WLm. When one of the word lines WL1 to WLm is driven by the row address decoder/word line driver unit 13, the n-channel enhancement type switching transistors QN11 of the associated row turn on, and the bit lines BLa or BLb are conducted with the storage capacitors CP11. If the bit line pairs BLP1 to BLPi have been charged to the precharging level Vp, the storage capacitors produce small differential voltage levels on the bit line pairs BLP1 to BLPi. On the other hand, if the bit line pairs BLP1 to BLPi have been already driven for producing differential voltage levels, either high or low voltage level is restored in each of the storage capacitors CP11.

The bit line pairs BLP1 to BLPi are further coupled with a plurality of sense amplifier circuits 141 to 14n, and the sense amplifier circuits 141 to 14n are implemented by flip flop circuits. Each of the flip flop circuits comprises a first series combination of a p-channel enhancement type field effect transistor QP15 and an n-channel enhancement type field effect transistor QN16 coupled between high and low power supply lines SAP and SAN and a second series combination of a p-channel enhancement type field effect transistor QP17 and an n-channel enhancement type field effect transistor QN18 also coupled between the high and low power supply lines SAP and SAN, and the gate electrodes in one of the first and second series combinations are coupled with the common drain node in the other of the first and second series combinations. The sense amplifier circuits 141 to 14n thus arranged is powered by the high and low power voltage lines SAP and SAN, and develop differential voltages on the associated bit line pairs BLP1 to BLPi.

The bit line pairs BLP1 to BLPi are further coupled with a column selector circuit 15, and the column selector circuit 15 is under the control of a column address decoder circuit 16. The columns of memory cells are respectively assigned column addresses, and the bit line pairs BLP1 to BLPi are also identified by the column addresses, respectively. The column address decoder circuit 16 is responsive to column address bits indicative of one of the column addresses, and allows the column selector circuit 15 to couple one of the bit line pairs BLP1 to BLPi with an input/ output data buffer circuit 17. The input/ output data buffer circuit 17 supplies a differential voltage indicative of an input data bit to the selected bit line pair, and produces an output data signal from the differential voltage on the selected bit line pair. The differential voltage on the selected bit line pair is indicative of the accessed data bit read out from one of the memory cells M11 to Mmn assigned the row address indicated by the row address bits and the column address indicated by the column address bits.

As described hereinbefore, the sense amplifier circuits 141 to 14n are powered by the high and low power voltage lines SAP and SAN, and the high and low power supply lines SAP and SAN are driven by a driver circuit 18. The driver circuit 18 comprises a p-channel enhancement type switching transistor QP19 coupled between an internal power voltage line 19 and the high power supply line SAP, an n-channel enhancement type switching transistor QN20 coupled with between a ground voltage line and the low power supply line SAN, an inverter IV11 coupled with the gate electrode of the p-channel enhancement type switching transistor QP19 and a balancing circuit 18a, and a series combination of n-channel enhancement type switching transistors QN21 and QN22 and an n-channel enhancement type switching transistor QN23 form in combination the balancing circuit 18a. The common source node of the n-channel enhancement type switching transistors QN21 and QN22 is coupled with a source of balance voltage Vb, and the drain nodes thereof are coupled with the high and low power supply lines SAP and SAN, respectively. The n-channel enhancement type switching transistor QN23 is coupled between the high and low power supply lines SAP and SAN, and the three n-channel enhancement switching transistors QN21 to QN23 are responsive to a balance control signal Sb. Namely, while the balance control signal Sb remains in active high voltage level, the n-channel enhancement type switching transistors QN21 to QN23 turn on, and the high and low power supply lines SAP and SAN are balanced at the balance voltage level Vb. However, if the balance control signal Sb goes down to inactive low voltage level, the high and low power supply lines SAP and SAN are blocked from the source of balance voltage Vb and from one another. An activation signal Sat is directly supplied to the gate electrode of the n-channel enhancement type switching transistor QN20 and to the input node of the inverter IV11. The inverter IV11 produces the complementary signal of the activation signal Sat, and supplies the complementary signal to the gate electrode of the p-channel enhancement type switching transistor QP19. Therefore, the n-channel enhancement type switching transistor QN20 and the p-channel enhancement type switching transistor QP19 concurrently turn on and off. The precharge control signal Sp, the balance control signal Sb and the activation signals are produced by a timing control circuit 20 at respective timings.

The internal power voltage line 19 is coupled with a power supply pin Pcc, and an internal power distributing unit 21 is associated with the internal power voltage line 19. A battery 22 is coupled through the power supply pin Pcc with the internal power distributing unit 21, and the internal power distributing unit 21 has a booster circuit. Even if the electromotive force of the battery 22 and, accordingly, an external power voltage Vcc are decreased, the internal power distributing unit 21 keeps the voltage level on the internal power voltage line 19 constant. Namely, if the battery 22 is exhausted and, accordingly, the external power voltage becomes low, the booster circuit 21 boosts the external power voltage level Vcc to boosted voltage level Vcch. The internal power distribution unit 21 may have the same configuration as that disclosed in Japanese Patent Application laid-open (Kokai) No. 60-83297.

Figure 3:
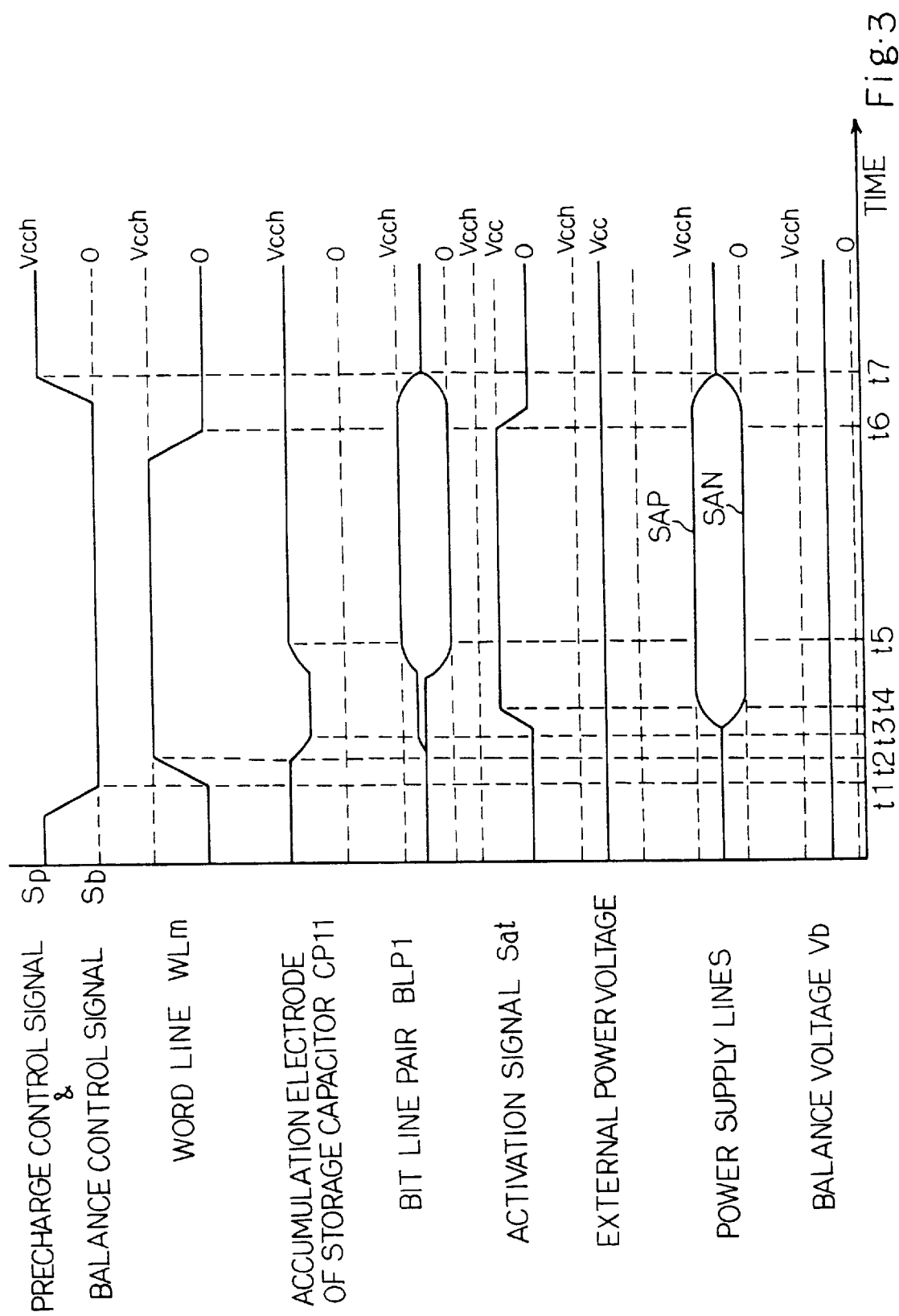
FIG. 3 is a timing chart showing a read-out operation on a memory cell incorporated in the dynamic random access memory device shown in FIG. 2.

The dynamic random access memory device thus arranged selectively enters a write-in mode, a read-out mode and a refresh mode of operation. FIG. 3 illustrates the sequence of the refresh mode on the assumption that the word line WLm is selected for refreshing. Although all of the memory cells coupled with the word line WLm are simultaneously refreshed, FIG. 3 focuses on the memory cell Mm1 only.

If a refresh address counter (not shown) is indicative of the row address assigned to the word line WLm, the precharge control signal Sp and the balance control signal Sb go down to the ground voltage level at time t1, and the bit line pair BLP1 and the power supply lines SAP and SAN are blocked from the source of precharging voltage level Vp and the source of balancing voltage level Vb.

The word line WLm goes up to the boosted voltage level Vcch at time t2, and the n-channel enhancement type switching transistor QN11 turns on. Then, the accumulation electrode of the storage capacitor CP11 is conducted through the n-channel enhancement type switching transistor QN11 with the bit line BLa of the bit line pair BLP1, and the bit line BLa is slightly lifted at time t3. However, the accumulation electrode slightly goes down. As a result, a small differential voltage takes place on the bit line pair BLP1.

The activation signal Sat goes up to the external power voltage level Vcc at time t4, and the inverter IV11 supplies the complementary signal of the ground voltage level to the n-channel enhancement type switching transistor QP19. The n-channel enhancement type switching transistor QN20 and the p-channel enhancement type switching transistor QP19 concurrently turn on, and the power supply lines SAP and SAN are changed to the boosted voltage level Vcch and the ground voltage level, respectively.

With the boosted voltage level Vcch and the ground voltage level, the sense amplifier circuit 141 is activated, and develops the small differential voltage on the bit line pair BLP1. The bit lines BLa and BLb reach the boosted voltage level Vcch and the ground voltage level at time t5, respectively. Accordingly, the accumulation electrode is recovered to the restore level or the boosted voltage level Vcch again.

The word line WLm is recovered to the ground voltage level at time t6, and the accumulation electrode is blocked from the bit line BLa. The precharge control signal Sp and the balance control signal Sb go up to the boosted voltage level Vcch at time t7, and the bit line pair BLP1 and the power supply lines SAP and SAN are recovered to the precharging voltage level Vp and the balancing voltage level Vb again. The refreshing operation is completed at time t7, and the refresh address counter increments the row address for the next refreshment.

As will be appreciated from the foregoing description, the internal power distributing unit 21 produces the boosted voltage level Vcch, and small differential voltages on the bit line pairs BLP1 to BLPi are developed to the large differential voltages between the boosted voltage level Vcch and the ground voltage level. This results in that the amount of accumulated charges is increased. Moreover, even if the battery 22 is exhausted, the internal power distribution unit 21 keeps the power supply line SAP constant, and prevents data bits stored in the memory cells from destruction.

Second Embodiment

Figure 4:
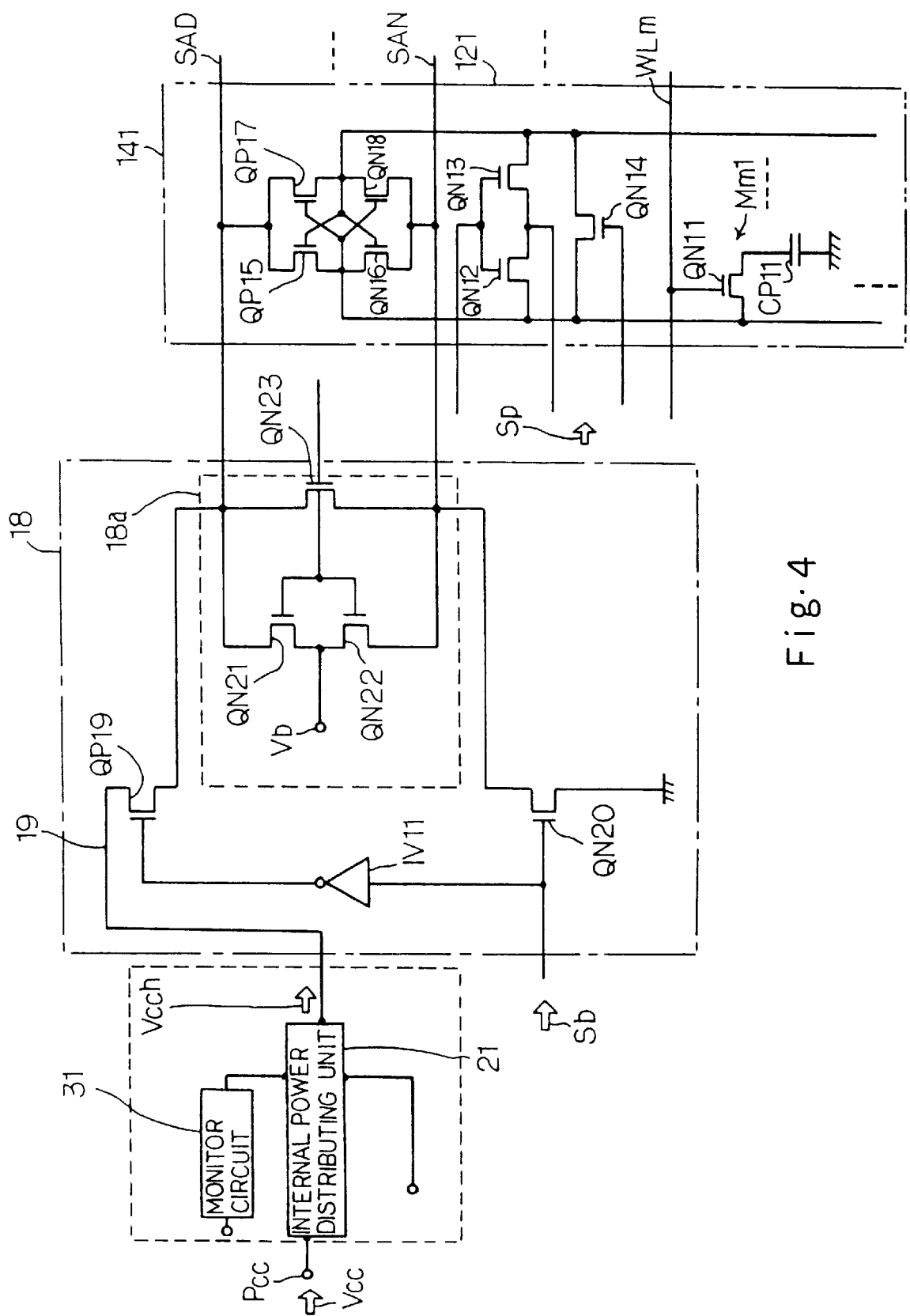
FIG. 4 is a circuit diagram showing the arrangement of another dynamic random access memory device according to the present invention.

Turning to FIG. 4 of the drawings, essential parts of another dynamic random access memory device embodying the present invention is illustrated, and the dynamic random access memory device implementing the second embodiment is similar to the first embodiment except for a monitoring circuit 31. For this reason, description is made on the monitoring circuit 31 only, and the other components are labeled with the same references designating the corresponding components of the first embodiment without any description.

The monitoring circuit 31 monitors the external power voltage Vcc to see whether or not the external power voltage Vcc is higher than a reference voltage. In this instance, the reference voltage is regulated to 1.5 volts. While the external power voltage Vcc is higher than the reference voltage, the internal power distribution unit 21 transfers the external power voltage Vcc to the internal power voltage line 19. However, if the external power voltage level Vcc reaches the reference voltage, the monitoring circuit 31 activates the booster circuit incorporated in the internal power distribution unit 21, and the booster circuit boosts the external power voltage level Vcc over the reference voltage. The boosted voltage level is supplied to the internal power voltage line 19, and the internal power voltage line 19 is kept constant regardless of the magnitude of the external power voltage Vcc.

Although particular embodiments of the present invention have been shown and described, it will be obvious to those skilled in the art that various changes and modifications may be made without departing from the spirit and scope of the present invention. For example, the booster circuit may be implemented by a bootstrapping circuit and a limiter circuit.

What is claimed is:

1. A dynamic random access memory device fabricated on a semiconductor substrate, comprising:

a) a memory cell array having a plurality of memory cells respectively storing data bits each in the form of electric charges;

b) a plurality of bit line pairs selectively coupled with said plurality of memory cells, and propagating data bits each in the form of differential voltage;

c) an addressing means operative to selectively couple said plurality of memory cells with said plurality of bit line pairs;

d) a plurality of sense amplifier circuits respectively coupled with said plurality of bit line pairs, and powered with high and low power voltage levels for developing the differential voltages on said plurality of bit line pairs;

d) a driver circuit coupled with said plurality of sense amplifier circuits, and supply said high and low power voltage level to said plurality of sense amplifier circuits; and e) a booster circuit coupled between a power supply pin and said driver circuit for keeping said high power voltage produced from an external power voltage level constant even if said external power voltage level is lowered.

2. A dynamic random access memory device as set forth in claim 1, in which further comprising f) a monitoring circuit operative to monitor said external power voltage, and activating said booster circuit when said external power voltage is lowered.

* * * * *

UNITED STATES PATENT AND TRADEMARK OFFICE
CERTIFICATE OF CORRECTION

PATENT NO. : 6,240,037 B1
DATED : May 29, 2001
INVENTOR(S) : Shinichi Kuwabara

It is certified that error appears in the above-identified patent and that said Letters Patent is hereby corrected as shown below:

Column 1,
Line 26, delete "onecapacitor" insert -- one-capacitor --;
Lines 42-43, delete "onecapacitor" insert -- one-capacitor --

Column 3,
Line 23, delete "dVxxVx-Vd=(Vs-Vd)xCs/(Cd+Cs)" insert -- $dVx = Vx - Vd = (Vs - Vd) \times Cs / (Cd + Cs)$ --

Signed and Sealed this

Eleventh Day of December, 2001

Attest:

NICHOLAS P. GODICI
Attesting Officer   Acting Director of the United States Patent and Trademark Office